US011823771B2

(12) United States Patent
Chawla et al.

(10) Patent No.: US 11,823,771 B2
(45) Date of Patent: Nov. 21, 2023

(54) STREAMING ACCESS MEMORY DEVICE, SYSTEM AND METHOD

(71) Applicants: STMicroelectronics International N.V., Geneva (CH); STMICROELECTRONICS S.r.l., Agrate Brianza (IT)

(72) Inventors: Nitin Chawla, Noida (IN); Thomas Boesch, Rovio (CH); Anuj Grover, New Delhi (IN); Surinder Pal Singh, Uttar Pradesh (IN); Giuseppe Desoli, San Fermo Della Battaglia (IT)

(73) Assignees: STMICROELECTRONICS S.r.l., Agrate Brianza (IT); STMicroelectronics International N.V., Geneva (CH)

( * ) Notice: Subject to any disclaimer, the term of this patent is extended or adjusted under 35 U.S.C. 154(b) by 130 days.

(21) Appl. No.: 17/158,875

(22) Filed: Jan. 26, 2021

(65) Prior Publication Data

US 2021/0241806 A1 Aug. 5, 2021

Related U.S. Application Data

(60) Provisional application No. 62/968,026, filed on Jan. 30, 2020.

(51) Int. Cl.
*G11C 8/04* (2006.01)
*G06N 3/02* (2006.01)

(52) U.S. Cl.
CPC ....... *G11C 8/04* (2013.01); *G06N 3/02* (2013.01)

(58) Field of Classification Search
CPC .......................................................... G11C 8/04
USPC .................................................... 365/230.02
See application file for complete search history.

(56) References Cited

U.S. PATENT DOCUMENTS

| | | | |
|---|---|---|---|
| 4,683,555 A | 7/1987 | Pinkham | |
| 6,188,377 B1 | 2/2001 | Campbell et al. | |
| 10,437,758 B1* | 10/2019 | Mathews | G06F 13/18 |
| 2014/0133208 A1 | 5/2014 | Buyuktosunoglu et al. | |
| 2018/0189229 A1 | 7/2018 | Desoli et al. | |
| 2018/0189424 A1 | 7/2018 | Boesch et al. | |
| 2020/0075677 A1* | 3/2020 | Wada | G11C 13/0028 |

OTHER PUBLICATIONS

Moon, et al., "Low-Power Sequential Access Memory Design," *Proceedings of the IEEE 2002 Custom Integrated Circuits Conference*, 2002, pp. 111-114.

* cited by examiner

*Primary Examiner* — Anthan Tran
(74) *Attorney, Agent, or Firm* — SEED INTELLECTUAL PROPERTY LAW GROUP LLP

(57) ABSTRACT

A system includes a random access memory organized into individually addressable words. Streaming access control circuitry is coupled to word lines of the random access memory. The streaming access control circuitry responds to a request to access a plurality of individually addressable words of a determined region of the random access memory by generating control signals to drive the word lines to streamingly access the plurality of individually addressable words of the determined region. The request indicates an offset associated with the determined region and a pattern associated with the streaming access.

33 Claims, 13 Drawing Sheets

STREAMING ACCESS MEMORY DEVICE, SYSTEM AND METHOD

BACKGROUND

Technical Field

The present disclosure generally relates to word line select circuits of a memory array. For example, the present disclosure relates to memory systems used in artificial neural networks (ANNs) and streaming applications.

Description of the Related Art

Processing cores and devices and systems including processing cores, such as processors, mobile phones, tablets, laptops, desktop computers, embedded processing systems, etc., may typically include one or more memories, such as cache memory, primary memory, secondary memory, etc. The memories may be volatile or non-volatile.

Memory may be shared memory which may be used, for example, by multiple processing cores, such as a host processing core and an application accelerator core, multiple processes, such as host system processes, application processes, etc. Such processing systems may be implemented using one or more integrated circuits. The integrated circuits may include, for example, processing cores, memory arrays, memory controllers, discrete circuitry, etc., and various combinations thereof.

Memory may be organized into arrays of rows and columns of bits. Each row may have a line to access a smallest addressable unit of the memory, typically called a word line, that spans all or a set of the columns of an array. Sets of columns corresponding to a word may span an entire row of the array, or each row may contain a plurality of words (e.g., columns 0-7 correspond to a first word, columns 8-15 correspond to a second word; columns 0-15 correspond to a first word, columns 16-31 correspond to a second word; etc.). Each column may have a bit line that spans the rows. By asserting one word line, all the bits in the corresponding row for the set of columns corresponding to the word may be accessed.

BRIEF SUMMARY

In an embodiment, a device comprises: one or more inputs configured to receive a streaming access request to access a plurality of individually addressable words of a determined region of a random access memory, the request indicating an offset associated with the determined region and a pattern of the streaming access; a plurality of outputs configured to couple to word lines of the random access memory; and streaming access control circuitry coupled to the one or more inputs and to the plurality of outputs and configured to respond to the streaming access request by generating control signals to drive the word lines to access the plurality of individually addressable words of the determined region. The request may include the offset associated with the determined region. The request may include an indication of a sequence of the streaming access. The streaming access control circuitry may identify the determined region based on the offset and the indication of the sequence of the streaming access. The streaming access control circuitry may include a memory configured to store streaming access control information and the indication is a command to perform a streaming access based on stored streaming access control information. The request may indicate a plurality of offsets defining the determined region. The streaming access control circuitry may comprise: stream control circuitry configured to generate the control signals to drive the word lines, the stream control circuitry including a plurality of shift registers and a bank of mulitplexers coupled to the plurality of shift registers; and configuration control circuitry configured to generate register data and control signals to control loading of the register data into the plurality of shift registers and shifting of the plurality of shift registers. A first data input of each multiplexer of the bank of mulitplexers may be coupled to a respective output of one of the plurality of shift registers and a select input of each multiplexer of the bank of mulitplexers may be coupled to a respective output of another of the plurality of shift registers. A second data input of each multiplexer of the bank of multiplexers may be coupled to an output of an adjacent multiplexer in the bank of multiplexers and the plurality of outputs may be coupled to respective outputs of multiplexers of the bank of multiplexers. The random access memory may be addressable in a three-dimensional address space. In an embodiment, the streaming access request comprises a sequential access request.

In an embodiment, a system comprises: a streaming access memory organized into individually addressable words; and streaming access control circuitry coupled to word lines of the streaming access memory, wherein the streaming access control circuitry, in operation, responds to a request to access a plurality of individually addressable words of a determined region of the streaming access memory by generating control signals to drive the word lines to access the plurality of individually addressable words of the determined region, wherein the request indicates an offset associated with the determined region and an indication of a pattern of the access to the streaming access memory. The request may include the offset associated with the determined region. The request may include an indication of a sequence of the access to the streaming access memory. The streaming access control circuitry may identify the determined region based on the offset and the indication of the sequence of the access to the streaming access memory. The request may indicate a plurality of offsets associated with the determined region. The plurality of offsets may define the determined region. The streaming access control circuitry may comprise: stream control circuitry configured to generate the control signals to drive the word lines, the stream control circuitry including a plurality of shift registers and a bank of mulitplexers coupled to the plurality of shift registers; and configuration control circuitry configured to generate register data and control signals to control loading of the register data into the plurality of shift registers and shifting of the plurality of shift registers. The streaming access memory may be addressable in a three-dimensional address space. In an embodiment, the system comprises random access control circuitry coupled to the word lines of the random access memory, wherein the random access control circuitry, in operation, responds to a request to access an individually addressable word of the random access memory. In an embodiment, the system comprises one or more convolutional accelerators coupled to the streaming access control circuitry and to the random access memory, wherein, in operation, the one or more convolutional accelerators provide requests to access a plurality of individually addressable words of a determined region of the random access memory to the streaming access control circuitry and receive responses to the requests from the streaming access memory. In an embodiment, the streaming access memory is a random access memory. The system may comprise a plurality of streaming access memories coupled together in series or in parallel.

In an embodiment, a method comprises: receiving, by streaming access control circuitry of a streaming access memory, a streaming access request to access a plurality of individually addressable words of a determined region of the random access memory, the request indicating an offset associated with the determined region and a pattern of the streaming access; and responding, by the streaming access control circuitry, to the request by generating control signals to drive word lines of the random access memory to access the plurality of individually addressable words of the determined region. The request may include the offset associated with the determined region. The request may include an indication of a sequence of the streaming access. The method may comprise, identifying, by the streaming access control circuitry, the determined region based on the offset and the indication of the pattern associated with the streaming access. The method may comprise storing, in a memory of the streaming access control circuitry, access pattern control information, wherein the indication is a command to perform an access based on stored access pattern control information. The request may indicate a plurality of offsets defining the determined region. The streaming access memory may be addressable in a three-dimensional address space.

In an embodiment, a non-transitory computer-readable medium's contents configure a streaming access controller of a streaming access memory to perform a method, the method comprising: receiving a streaming access request to access a plurality of individually addressable words of a determined region of the streaming access memory, the request indicating an offset associated with the determined region and a pattern of the access; and responding to the request by generating control signals to drive word lines of the streaming access memory to access the plurality of individually addressable words of the determined region. The request may include the offset associated with the determined region and an indication of the pattern of the streaming access. The streaming access memory may be addressable in a three-dimensional address space and the determined region may be a three-dimensional region in the three-dimensional address space. The contents may comprise a look-up table storing registry and timing information used by the streaming access controller to generate the control signals to drive the word lines.

BRIEF DESCRIPTION OF THE SEVERAL VIEWS OF THE DRAWINGS

Reference will now be made, by way of example to the accompanying drawings. In the drawings, identical reference numbers identify similar elements or acts, unless the context indicates otherwise. In some drawings, however, different reference numbers may be used to indicate the same or similar elements. The sizes and relative positions of elements in the drawings are not necessarily drawn to scale. Some of these elements may be enlarged and positioned to improve drawing legibility. The particular shapes of the elements as drawn are not necessarily intended to convey any information regarding the actual shape of particular elements and have been selected solely for ease of recognition in the drawings.

DETAILED DESCRIPTION

Figure 1:
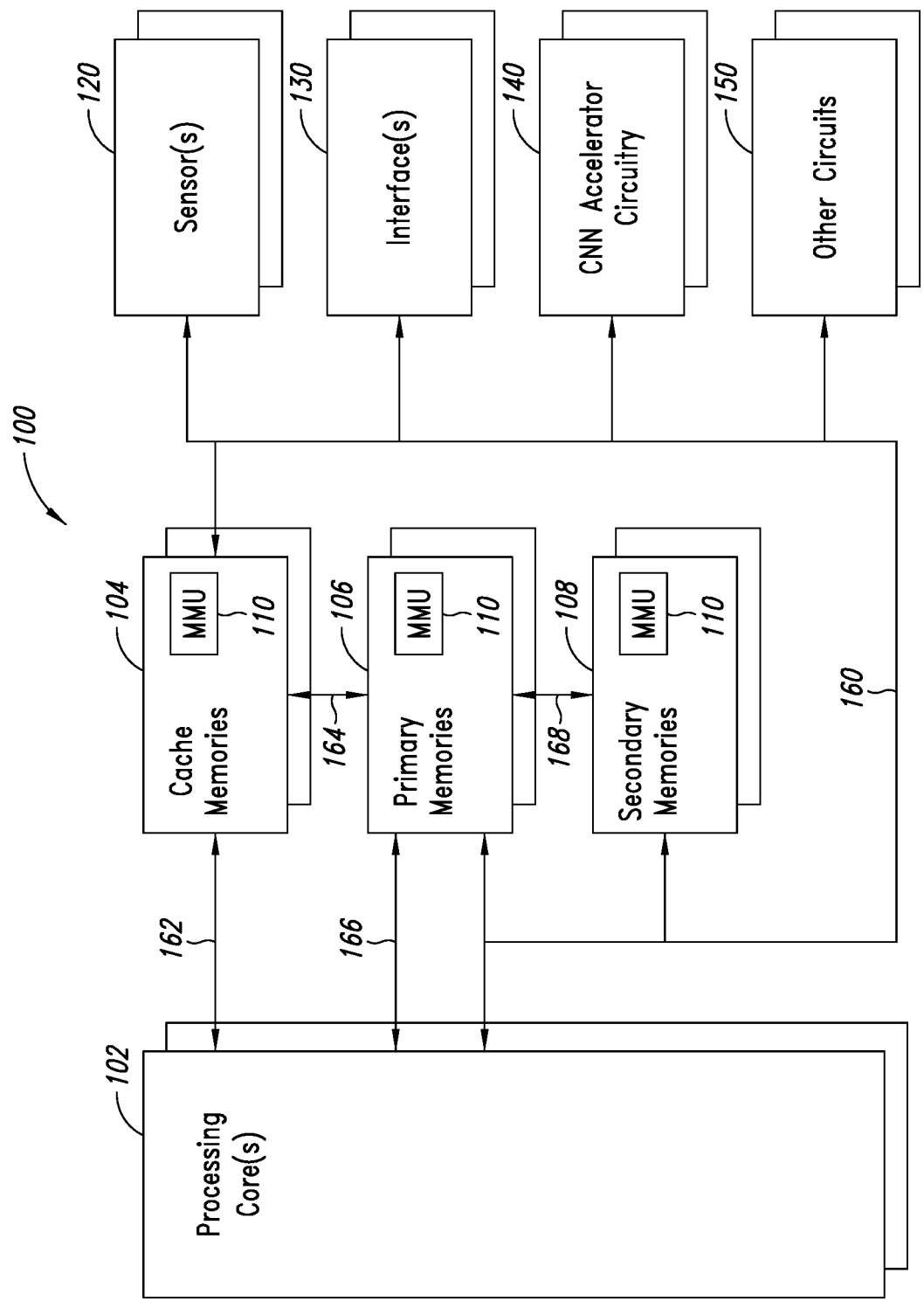
FIG. 1 is a functional block diagram of an embodiment of an electronic device or system having a processing core and a memory and implementing an artificial neural network.

In the following description, certain details are set forth in order to provide a thorough understanding of various embodiments of devices, systems, methods and articles. However, one of skill in the art will understand that other embodiments may be practiced without these details. In other instances, well-known structures and methods associated with, for example, circuits, such as transistors, multipliers, adders, dividers, comparators, integrated circuits, logic gates, finite state machines, memories, interfaces, bus systems, etc., have not been shown or described in detail in some figures to avoid unnecessarily obscuring descriptions of the embodiments.

Unless the context requires otherwise, throughout the specification and claims which follow, the word "comprise" and variations thereof, such as "comprising," and "comprises," are to be construed in an open, inclusive sense, that is, as "including, but not limited to." Reference to "at least one of" shall be construed to mean either or both the disjunctive and the inclusive, unless the context indicates otherwise.

Reference throughout this specification to "one embodiment," or "an embodiment" means that a particular feature, structure or characteristic described in connection with the embodiment is included in at least one embodiment. Thus, the appearances of the phrases "in one embodiment," or "in an embodiment" in various places throughout this specification are not necessarily referring to the same embodiment, or to all embodiments. Furthermore, the particular features, structures, or characteristics may be combined in any suitable manner in one or more embodiments to obtain further embodiments.

The headings are provided for convenience only, and do not interpret the scope or meaning of this disclosure.

Video streaming and artificial neural network systems may typically employ streaming memory access rather than random memory access, even when accessing a random access memory using random access decoding circuitry. Examples of memory access methods for these applications include line buffer and kernel buffer memory access. Typically, streaming access to a random access memory is performed by setting an initial row and providing circular serial memory access through the entire array using the random access decoding circuitry.

The inventors have realized that when the data is stored in a random access memory, word line select circuitry for streaming access may be simpler and more area efficient than for random memory access. In other words, the random access decoding process, and associated circuitry and delays, may be avoided by instead using streaming access control techniques and circuitry to access streams of the stored data.

In an embodiment, a more flexible type of word line select may be provided, that facilitates saving time by accessing a memory array beginning at a memory array row in which a target data structure begins and ending the access at the memory array row in which the target data structure ends. An embodiment may facilitate streaming memory access by various processes concurrently, while facilitating avoiding time and area penalties that may occur when using random memory access techniques to implement a streaming access.

FIG. 1 is a functional block diagram of an embodiment of an electronic device or system 100 of the type to which the embodiments which will be described may apply. The system 100 comprises one or more processing cores or circuits 102. The processing cores 102 may comprise, for example, one or more processors, a state machine, a microprocessor, a programmable logic circuit, discrete circuitry, logic gates, registers, etc., and various combinations thereof. The processing cores may control overall operation of the system 100, execution of application programs by the system 100, etc.

The system 100 includes one or more memories, such as one or more volatile and/or non-volatile memories which may store, for example, all or part of instructions and data related to control of the system 100, applications and operations performed by the system 100, etc. As illustrated, the system 100 includes one or more cache memories 104, one or more primary memories 106, and one or more secondary memories 108, each comprising memory management circuitry or MMUs 110. One or more of the memories 104, 106, 108 includes a memory array (see, e.g., memory array 208 of FIG. 2, memory array 708 of FIG. 7A), which, in operation, may be shared by one or more processes executed by the system 100.

The system 100 may include one or more sensors 120 (e.g., accelerometers, pressure sensors, temperature sensors, etc.), one or more interfaces 130 (e.g., wireless communication interfaces, wired communication interfaces, etc.), one or more ANN circuits, as illustrated convolutional neural network (CNN) accelerator circuits 140, and other circuits 150, which may include other functional circuits, antennas, power supplies, etc., and a main bus system 160. The main bus system 160 may include one or more data, address, power and/or control buses coupled to the various components of the system 100. The system 100 also may include additional bus systems such as bus system 162, which communicatively couples the cache memory 104 and the processing core 102, bus system 164, which communicatively couples the cache memory 104 and the primary memory 106, bus system 166, which communicatively couples the primary memory 106 and the processing core 102, and bus system 168, which communicatively couples the primary memory 106 and the secondary memory 108.

The primary memory or memories 106 are typically the working memory of the system 100 (e.g., the memory or memories upon which the processing cores 102 work or upon which co-processors such as the CNN accelerator circuitry 140 work), and may typically be a volatile memory (e.g., DRAM) of a limited size storing code and data related to processes executed by the system 100. For convenience, reference herein to data stored in a memory may also refer to code stored in a memory. Non-volatile memories, such as SRAM, ReRAM, PCM, MRAM, FRAM, multilevel memories, etc., may be employed as or in the primary memory or memories in an embodiment. The secondary memory 108 may typically be a non-volatile memory, which stores instructions and data, which may be retrieved and stored in the primary memory 106 when needed by the system 100. The cache memory 104 may be a relatively fast memory compared to the secondary memory 108 and typically has a limited size, which may be larger than a size of the primary memory 106.

The cache memory 104 temporarily stores code and data for later use by the system 100. Instead of retrieving needed code or data from the secondary memory 108 for storage in the primary memory 106, the system 100 may check the cache memory 104 first to see if the data or code is already stored in the cache memory 104. A cache memory 104 may significantly improve performance of a system, such as the system 100, by reducing the time and other resources needed to retrieve data and code for use by the system 100. When code and data are retrieved (e.g., from the secondary memory 108) for use by the system 100, or when data or code are written (e.g., to the primary memory 106 or to the secondary memory 108), a copy of the data or code may be stored in the cache memory 104 for later use by the system 100. Various cache management routines may be employed to control the data stored in the cache memory or memories 104.

Figure 2:
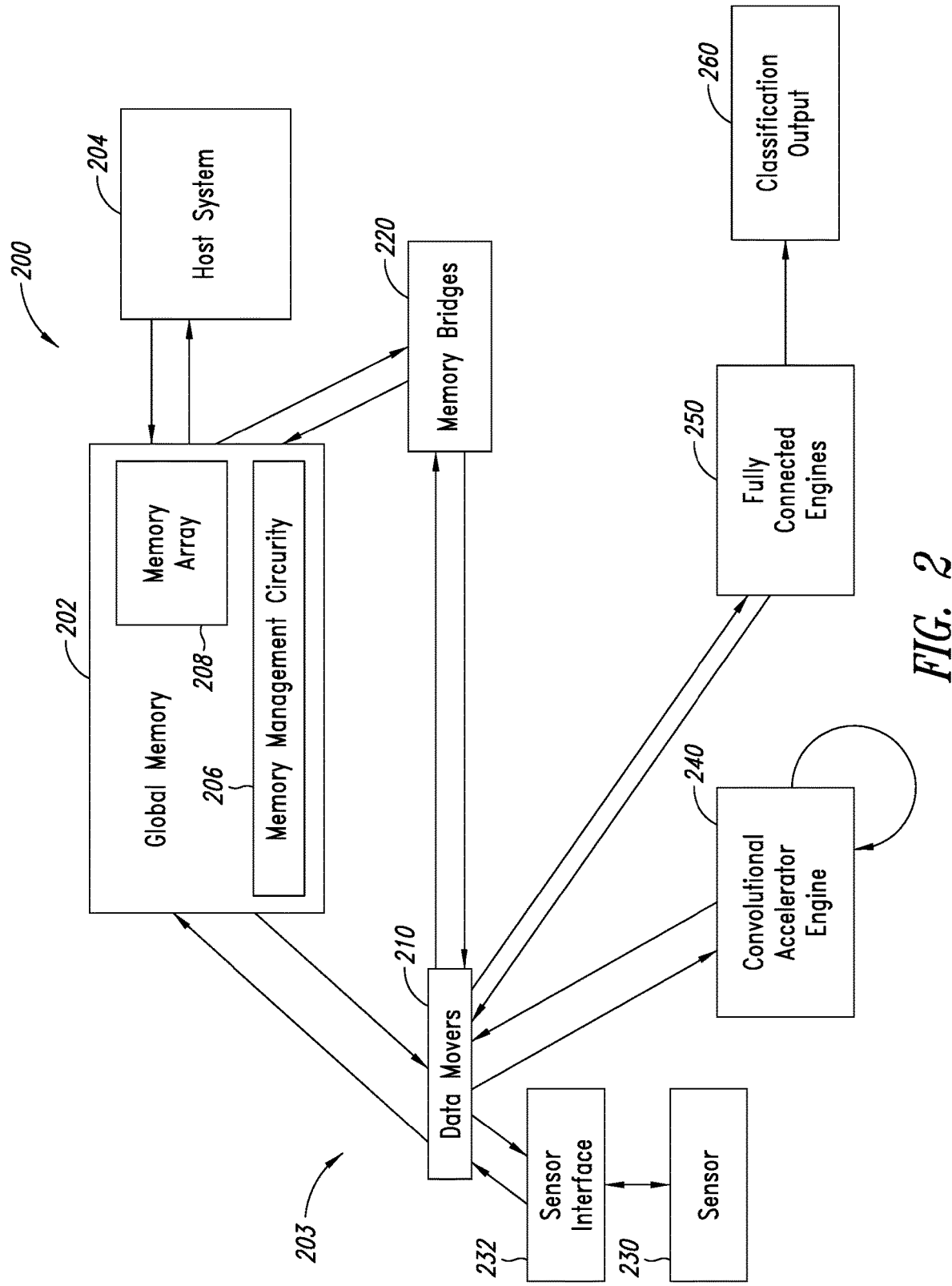
FIG. 2 is a functional block diagram of an embodiment of an electronic device or system implementing an artificial neural network.

FIG. 2 is a functional block diagram of an embodiment of an electronic device or system 200 of the type to which the embodiments which will be described may apply. The system 200 may be used, for example, to implement an ANN to classify sensor data. It is noted that the embodiment of FIG. 1 may be employed to implement the embodiment of FIG. 2, and may comprise a system on a chip (SoC).

The system 200 comprises a global memory 202, which may serve for example as a primary memory (see primary memory 106 of FIG. 1), for both ANN 203 processes or clusters, and for host system 204 processes or clusters. The global memory 202 comprises memory management circuitry 206 and one or more shared memory arrays 208. The memory management circuitry 206, in operation, employs one or more memory management routines to allocate regions of the global memory 202, such as regions of the shared memory arrays 208 to various processes executed by the system 200, and to control accesses to the global memory 202, such as accesses to regions of the shared memory arrays 208.

The memory arrays 208 may include non-volatile memory cells, static memory cells, resistive (ReRAM) memory cells, multilevel ReRam memory cells, ferroelectric (FRAM) memory cells, programmable memory (PROM), electrically erasable memory, modified bit cells having both storage and compute elements, etc., and various combinations thereof.

For example, a significant amount of energy may be spent moving data. Streaming and data flow impact the way data is moved. Instead of just moving data, computations may be performed in-memory to reduce the energy used. Using memory cells having both storage and compute elements may facilitate substantial reductions in power usage. The compute elements may be, for examples, adders or sensing circuits, which sum the data stored in a region of the memory array (e.g., sums the values in a cluster defined by one or more rows of one or more columns of a region). The compute/logical element may provide functionality like XNOR/XOR in the bitcell or elsewhere in the memory array, which may be used for implementing multiplication in case of BNN (Binary Neural Networks). This enhanced functionality in or around the bit cell can also be used to implement Garbled Circuits for encryption and description, for example, in neural network computations. The use of memories having compute and storage elements may facilitate increasing the security of a system; while data moves through the system its actual value is encrypted. Modified bit cell memory schemes and their orchestration as compute elements can also lead to Cross-bar (multiple bit and word lines in parallel accessed in parallel) architectures to facilitate high throughput in-memory compute operations.

In an embodiment, the management routines, types of access, and control circuitry employed to access the memory arrays may be based on request type information, for example as discussed in more detail with reference to FIGS. 7 to 12.

As illustrated, the ANN 203 comprises one or more data movers 210, one or more memory bridges 220, one or more sensors 230 and corresponding sensor interfaces 232, one or more convolutional accelerator engines 240, and one or more fully connected engines 250, which may be implemented and operate in an otherwise conventional manner to produce a classification output 260.

Efficient low power operation may be facilitated by using a hierarchical memory system and efficient reuse of local data. Accelerating CDNN convolutional layers may account for more than 90% of total operations. Efficient balancing of the computational and memory resources for both bandwidth and area may facilitate achieving better throughput without hitting associated ceilings. A design time configurable accelerator framework (CAF) (see FIG. 3) may be used based on unidirectional links transporting data streams via configurable data movers sources/sinks being I/O interfaces (e.g. cameras), memory hierarchies and various types of accelerators including the Convolution Accelerator (CA).

The data movers 210, in operation, move data streams between IOs (e.g., sensor interfaces 232), memory hierarchies (e.g., global memory 202, memory bridges 220), convolutional accelerators 240 and fully connected engines 250. In an embodiment, a full featured backpressure mechanism handles the data flow control and stream multicasting, facilitating the reuse of a data stream at multiple block instances. Linked lists may control the fully autonomous processing of entire convolution layers in ANN. Multiple accelerators may be grouped or chained to handle varying sizes for feature maps data and multiple kernels in parallel.

In an embodiment, the convolutional accelerator engines 240 may comprise an array of clustered multiply-accumulate (MAC) units or circuits, which, in operation, implement the convolutional layer processing in ANN. The convolutional accelerator engines may include a line buffer to fetch multiple feature map data words in parallel with a single memory access. A register-based kernel buffer may be used which provides multiple read ports, while a plurality of multibit fixed point MAC units or circuits perform multiple MAC operations per clock cycle. An adder tree may be employed to sum the MAC results for each kernel column. An overlapping, column based calculation of the MAC operations facilitates an optimal reuse of the feature maps data for multiple MACs and reducing of the power dissipation associated with redundant memory accesses.

In some embodiments, the system 100 or the system 200 may include more components than illustrated, may include fewer components than illustrated, may split illustrated components into separate components, may combine illustrated components, etc., and various combinations thereof. For example, the secondary memory 108 of FIG. 1 may comprise an external memory coupled to the system 100 through an interface, in addition to or instead of an internal secondary memory. In some embodiments, the primary memory 106 and the secondary memory 108 may be combined into a single memory. In some embodiments, the cache memory 104 may be omitted. In another example, the one or more primary memories 106 may share common memory management circuitry, in addition to or instead of separate MMUs 110.

In the context of embedded ANN systems, the bulk of the on-chip memory for the ANN system may be needed to store kernel data, intermediate partial sums, and feature data, which are accessed frequently, while a smaller portion may be needed to store configuration/layer sequence data, which are accessed less frequently. Thus, accessing shared memory based on the type of memory request (e.g., streaming memory accesses by ANN accelerator circuitry) may significantly decrease processing time. The inventors have realized that conventional streaming memory access based on random access routines has time penalties built in, slowing access time. For instance, a memory array that initializes at the first row may needlessly access rows until the row with the desired data or instruction is reached. Repeat access of the same data makes the time penalty even more expensive. Memory access by concurrent processes may be hampered by the processes having to wait until the accessing process has finished its memory access.

Figure 3:
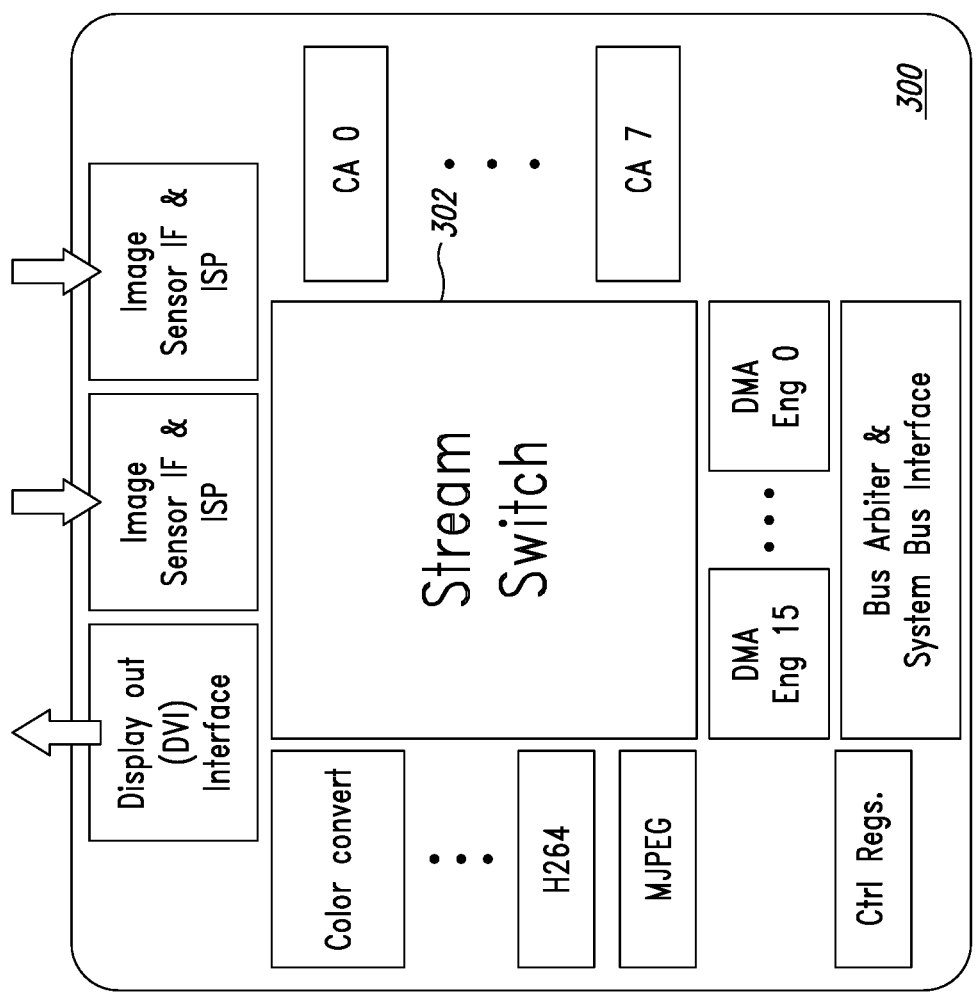
FIG. 3 is a functional block diagram of an embodiment of a configurable accelerator framework (CAF).

FIG. 3 is a functional block diagram of an embodiment of a configurable accelerator framework (CAF) 300, which may be organized as an image and deep convolutional neural network (DCNN) co-processor subsystem of a SoC, such as the system 200 of FIG. 2 when implemented as a SOC. As described herein, the CAF 300 includes a reconfigurable dataflow accelerator fabric connecting high-speed camera interfaces with any one or more of sensor processing pipelines, croppers, color converters, feature detectors, video encoders, eight channel digital microphone interface, streaming DMAs and a plurality of convolution accelerators. Briefly, the CAF 300 receives incoming image data, such as from a camera interface, or other sensors, and distributes the incoming data to the various components of the CAF 300 (e.g., convolution accelerators) and/or one or more of the plurality of DSPs to employ the DCNN and recognize objects in the incoming images.

The CAF 300 utilizes unidirectional links to transport data streams via a configurable, fully connected switch to or from different kinds of source or sink components. For example, the configurable fully connected switch may transport data via direct memory accesses (DMAs) to the SoC global memory (see global memory 202 of FIG. 2), I/O interfaces (e.g., cameras), and various types of accelerators (e.g., convolution accelerator (CA)).

In each CA, a register-based kernel buffer provides multiple read ports (e.g., 36), while multiple fixed-point multiply-accumulate (MAC) units (e.g., 36 16-bit MAC units) perform multiple MAC operations per clock cycle (e.g., up to 36 operations per clock cycle). An adder tree accumulates MAC results for each kernel column. The overlapping, column based calculation of the MAC operations allows an acceptably reuse of the feature maps data for multiple MACs, thus reducing power consumption associated with redundant memory accesses.

Kernel sets are partitioned in batches processed sequentially and intermediate results can be stored in the SoC global memory (see global memory 202 of FIG. 2). Various kernel sizes (e.g., up to 12×12), various batch sizes (e.g., up to 16), and parallel kernels (e.g., up to 4) can be handled by a single CA instance but any size kernel can be accommodated with the accumulator input.

The configurable batch size and a variable number of parallel kernels enable acceptably trade-offs for the available input and output bandwidth sharing across different units and the available computing logic resources. The CAF 300 includes a stream switch 302 that provides a design time parametric, run-time reconfigurable accelerator interconnect framework to support data-flow based processing chains.

Figure 4:
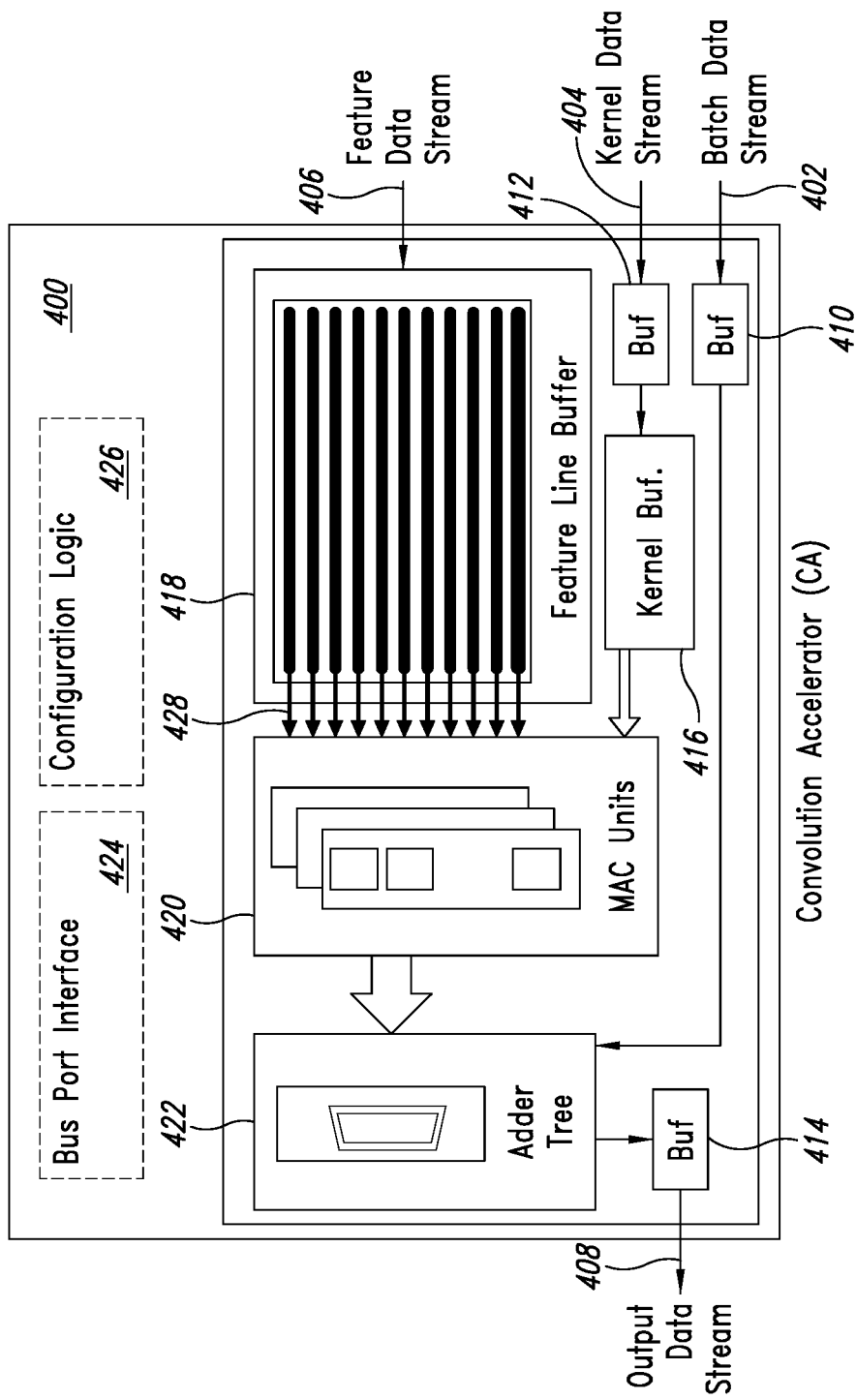
FIG. 4 is a functional block diagram of an embodiment of a convolutional accelerator.

FIG. 4 illustrates a convolution accelerator (CA) embodiment 400, which may be employed, for example, in an embodiment of the system 100 of FIG. 1, the embodiment of the system 200 of FIG. 2, or as any one or more of the convolution accelerators of FIG. 3. The CA 400 includes three input data interfaces and one output data interface that are each arranged for coupling to a stream switch 302 (See FIG. 3). A first CA input data interface 402 is arranged for coupling to a first stream switch output port, a second CA input data interface 404 is arranged for coupling to a second stream switch output port, and a third CA input data interface 406 is arranged for coupling to a third stream switch output port. A CA output data interface 408 is arranged for coupling to a selected stream switch input port.

In an exemplary embodiment, the first CA input data port 402 is arranged to pass a stream of batch data into the CA 400, the second CA input data port 404 is arranged to pass a stream of kernel data into the CA 400, and the third CA input data port 406 is arranged to pass a stream of feature data into the CA 400. The output data port 408 is arranged to pass an output data stream from the CA 400.

The CA 400 includes several internal memory buffers. The internal memory buffers may share a common memory space in some embodiments. In other embodiments, some or all of the internal memory buffers may be separate and distinct from each other. The internal memory buffers may be formed as registers, flip flops, static or dynamic random access memory (SRAM or DRAM), or in some other structural configuration. In some cases, the internal memory buffers may be formed using a multiport architecture that lets, for example, one device perform data "store" operations in the memory while another device performs data "read" operations in the memory.

A first CA internal buffer 410 is physically or virtually arranged in line with the first CA input data interface 402. In this way, batch data streamed into the CA 400 may be automatically stored in the first CA internal buffer 410 until the data is passed to a particular math unit in the CA 400 such as an adder tree 422. The first CA internal buffer 410 may be fixed with a size that is determined at design time. Alternatively, the first CA internal buffer 410 may be defined with a variable size that is determined programmatically at boot time or run time. The first CA internal buffer 410 may be 64 bytes, 128 bytes, 256 bytes, or some other size.

A second CA internal buffer 412 and a third CA internal buffer 414 are formed along the lines of the first CA internal buffer 410. That is, the second and third CA internal buffers 412, 414 may each have their own fixed size that is determined at design time. Alternatively, the second and third CA internal buffers 412, 414 may have a variable size that is determined programmatically at boot time or run time. The second and third CA internal buffers 412, 414 may be 64 bytes, 128 bytes, 256 bytes, or some other size. The second CA internal buffer 412 is physically or virtually arranged in line with the second CA input data interface 404 to automatically store streamed kernel data until the kernel data is passed to a dedicated fourth CA internal buffer 416 that is dedicated to storing kernel buffer data. The third CA internal buffer 414 is physically or virtually arranged in line with the adder tree 422 to automatically store summed data until it can be passed through the CA output interface 404.

The fourth CA internal buffer 416 is a dedicated buffer arranged to desirably store kernel data and apply the stored kernel data to a plurality of CA multiply-accumulate (MAC) units 420.

The fifth CA internal buffer 418 is a feature line buffer that is arranged to receive streamed feature data passed through the third CA input interface 406. Once stored in the feature line buffer, the feature data is applied to the plurality of CA MAC units 420. Feature and kernel buffer data applied to the CA MAC units 420 is mathematically combined according to convolutional operations, and the resulting output products from the CA MAC units 420 are passed to the CA adder tree 422. The CA adder tree 422 mathematically combines (e.g., sums) the incoming MAC unit data and batch data passed through the first CA input data port.

In some cases, the CA 400 also includes an optional CA bus port interface 424. The CA bus port interface 424, when it is included, may be used to pass data into or out from the CA 400 from SoC global memory (see global memory 202 of FIG. 2) or some other location. In some cases, the CA 400 may also include CA configuration logic 426.

Figure 5:
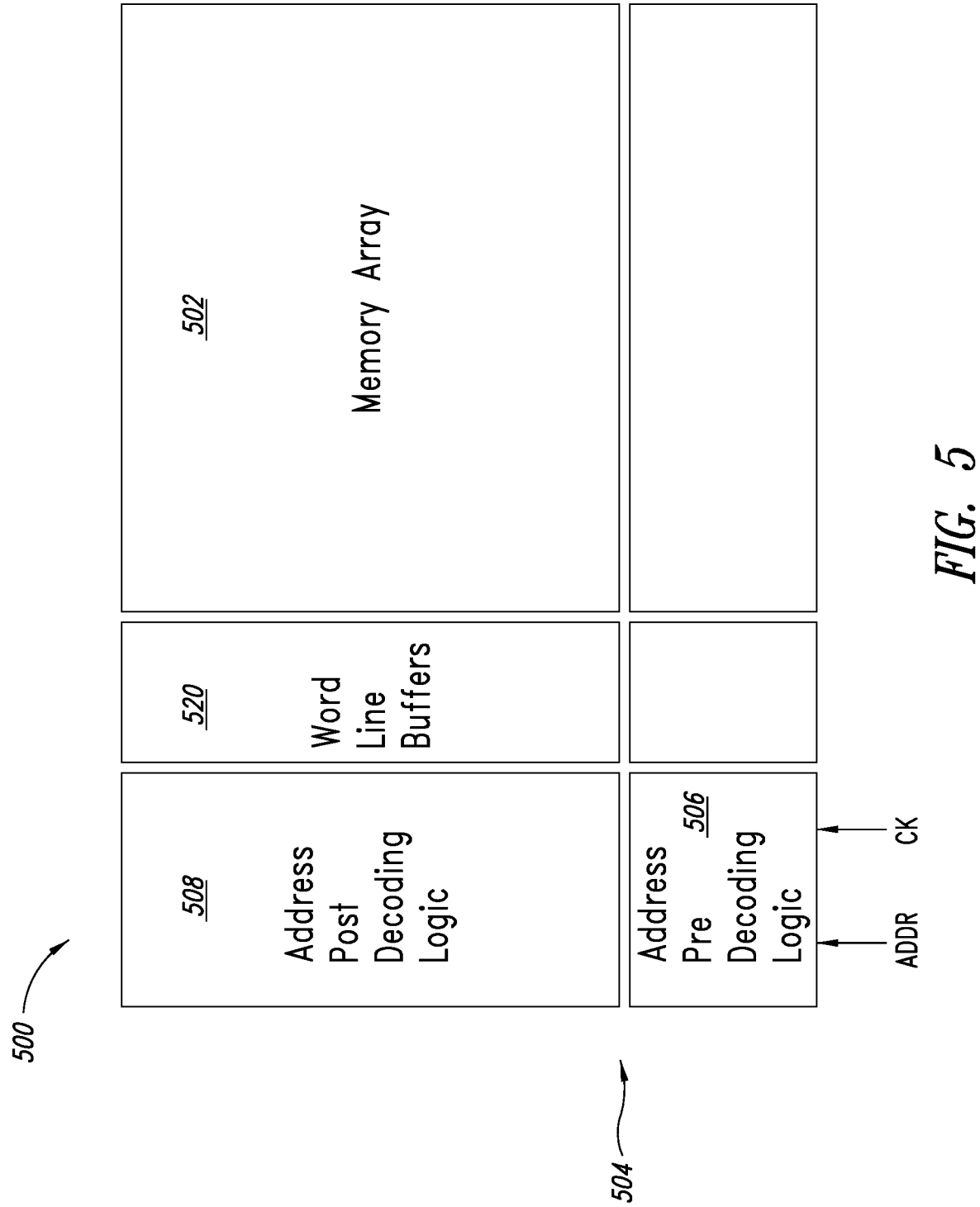
FIG. 5 is a functional block diagram of an embodiment of a random access memory.

FIG. 5 is a top view of an embodiment of a random access memory (RAM) 500 having a memory array 502, address decoding logic 504, which as illustrated includes pre decoding logic 506 and post decoding logic 508. The memory array 502 is organized in rows and columns. Address and clock signals are provided to address pre decoding logic 506, which decodes the address to generate control signals to control the post decoding logic 508. The post decoding logic drives word line buffers 520, which in turn drive row enable or word lines (not shown). An enabled word line may allow access (read or write) to bit contents of the respective row of the memory array. The random access memory 500 typically employs considerable combinational logic circuitry dedicated to the address pre decoding logic 506 and the address post decoding logic 508 to translate a memory address input to a word line output to the memory array 502.

Figure 6:
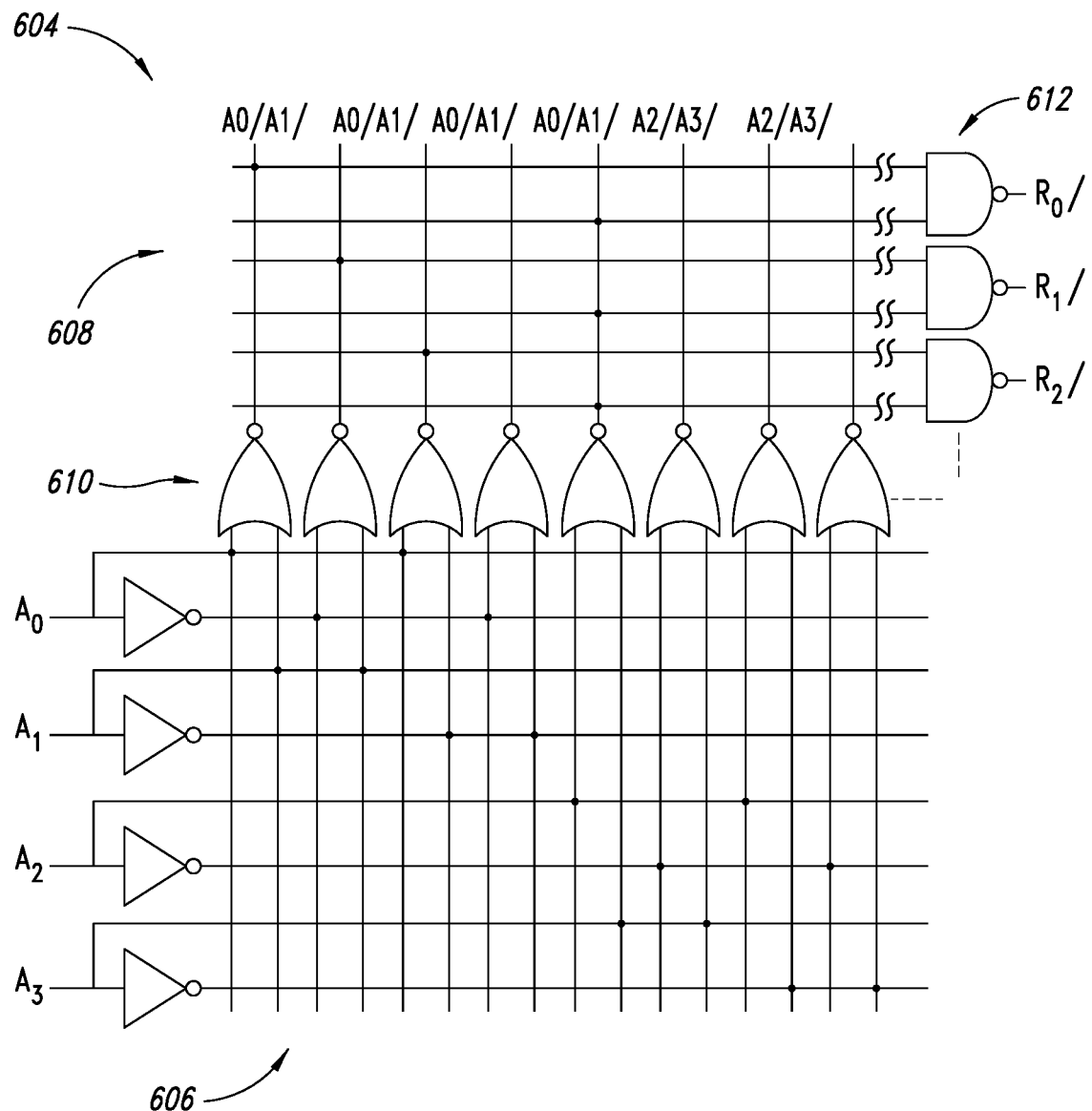
FIG. 6 is a functional block diagram of an embodiment of random access decoding circuitry of a random access memory.

FIG. 6 illustrates an example embodiment of conventional address decoding logic 604, including pre decoding logic 606 and post decoding logic 608. The decoding logic 604 includes a plurality of logic gates 610, 612, which impacts the area and power used for word line selection, as well as the delay associated with selecting word lines in response to a memory access. The gates 610, 612 may be dynamic, static or various combinations thereof, in accordance with various power, performance and area trade-offs.

The inventors have realized using deterministic or defined patterns to access a memory array in the context of streaming accesses may facilitate avoiding large layout area and high power consumption associated with conventionally accessing RAM in a sequential manner from an initial starting address. For example, accessing RAM in connection with ANN line buffer (see feature line buffer 418 of FIG. 4)

and kernel buffer (see kernel buffer 416 of FIG. 4) access. Patterns which facilitate streaming access, serial access, or otherwise access a memory array in a streaming manner may be employed to simplify the circuitry used to access the memory array, reduce the associated time delays and power costs, etc. Embodiments may employ dedicated memory with a simplified access circuitry (e.g., one or more memories arrays dedicated to storing data for use in streaming accesses such as accesses associated with ANN line buffers, kernel buffers, etc., having address circuitry which accesses the memory in a streaming manner based on defined patterns), or shared memory having conventional RAM access circuitry as well access circuitry which accesses the memory in a streaming manner based on deterministic or defined patterns (e.g., a shared memory having portions dynamically allocated to processes which use conventional RAM access and to processes which use streaming access, and using respective access circuitry to respond to such access requests), etc.

Figure 7:
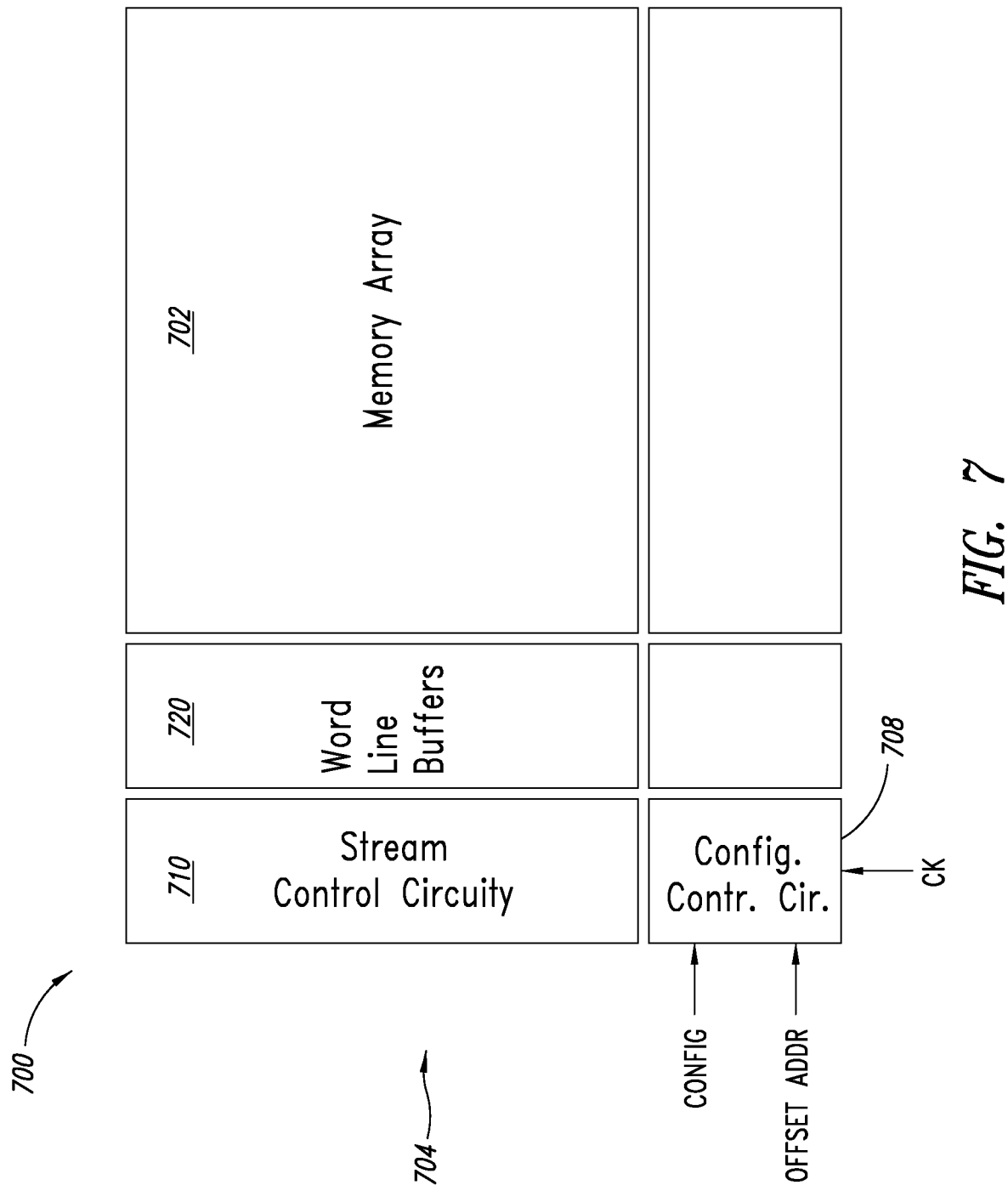
FIG. 7 is a functional block diagram of an embodiment of a streaming access memory.

FIG. 7 is a top view of an embodiment of a streaming access memory 700, which includes a random access memory array 702 organized in rows and columns. Word line buffers 720 drive the word lines. An enabled word line may allow access (read or write) to bit contents of the respective row of the memory array 702. Streaming access control circuitry 704 includes configuration control circuitry 708 and stream control circuitry 710 and controls generation of the word line signals. The streaming access control circuitry 704 may use significantly less area than the address decoding logic for a conventional RAM memory array. Offset information and streaming access configuration information are provided to the configuration control circuitry 708, which may generate control signals to control the stream control circuitry 710 based on the offset information and the streaming access configuration information. The offset and configuration information may comprise one or more offset addresses to define a region of the memory to be accessed (e.g., an offset to identify a starting row of an access, an offset to identify an ending row of an access request, an offset to identify a starting column of an access, an offset to identify an ending column of an access, a z-axis offset to identify a starting slice of a three-dimensional memory array, a z-axis offset to identify an ending slide of a three dimensional memory array, offsets to identifying regions associated with a striding access, etc. and various combinations thereof) and one or more access request types to define a type of access (e.g., an access request size, an access stride distance, an indication of a backward access and a re-access or repeat accesses, etc.). For temporal serial access, configuration information may include information identifying multi-stream accesses and inter-arrival time thresholds. The configuration information may include compute operations to be performed (e.g., adding of values stored in regions of the memory such as a row of an accessed region, XOR functions to be applied to data stored in regions of the streaming access memory, etc.). Such compute operations may be implemented as in-memory compute operations (e.g., in bit cells, elsewhere in the memory), or separate from the memory. Based on control signals generated by the configuration control circuitry 708 in response to the offset addresses and configuration information, the stream control circuitry 710 generates signals to control the activation of bit and word lines (see FIG. 10), for example, via word line buffers 720.

As noted above, memory may be organized into arrays of rows and columns of bits. Each row may have a line to access a smallest addressable unit of the memory, typically called a word line, that spans all or a set of the columns of an array. Sets of columns corresponding to a word may span an entire row of the array, or each row may contain a plurality of words (e.g., columns 0-7 correspond to a first word, columns 8-15 correspond to a second word; columns 0-15 correspond to a first word, columns 16-31 correspond to a second word; etc.). Each column may have a bit line that spans the rows. By asserting one or more word lines, all the bits in the corresponding row for the set of columns corresponding to the one or more words may be accessed. Generally, a word corresponds to 16 bits, or columns. However, a random access memory may be configured with words of sizes other than 16 bits.

In addition, a memory may be organized as a set of arrays. Thus, an address or a set of addresses in a memory may be specified, for example, by one or more z or depth offsets (e.g., an offset which specifies an array or arrays of a set of arrays contain a set of cells to be accessed), by one or more x or column or word offsets (e.g., which columns or words contain the set of cells to be accessed) and by one or more y or row offsets (e.g., which rows of the identified arrays contain the set of cells to be accessed). Alternative ways of defining the set of cells to be accessed may be employed (e.g., using starting offsets and a number of arrays, rows, columns or words spanned by the set of cells to be accessed). Frames consisting of blocks of arrays also may be employed. For example, a memory may be logically or physically organized into frames, with each frame comprises a set of Z arrays each having a number X of columns (of bits, words or bytes) and a number Z of rows (of bits, words or bytes). Cascading arrays of streaming access memories may be employed, where data flows between streaming access memories.

Figure 8:
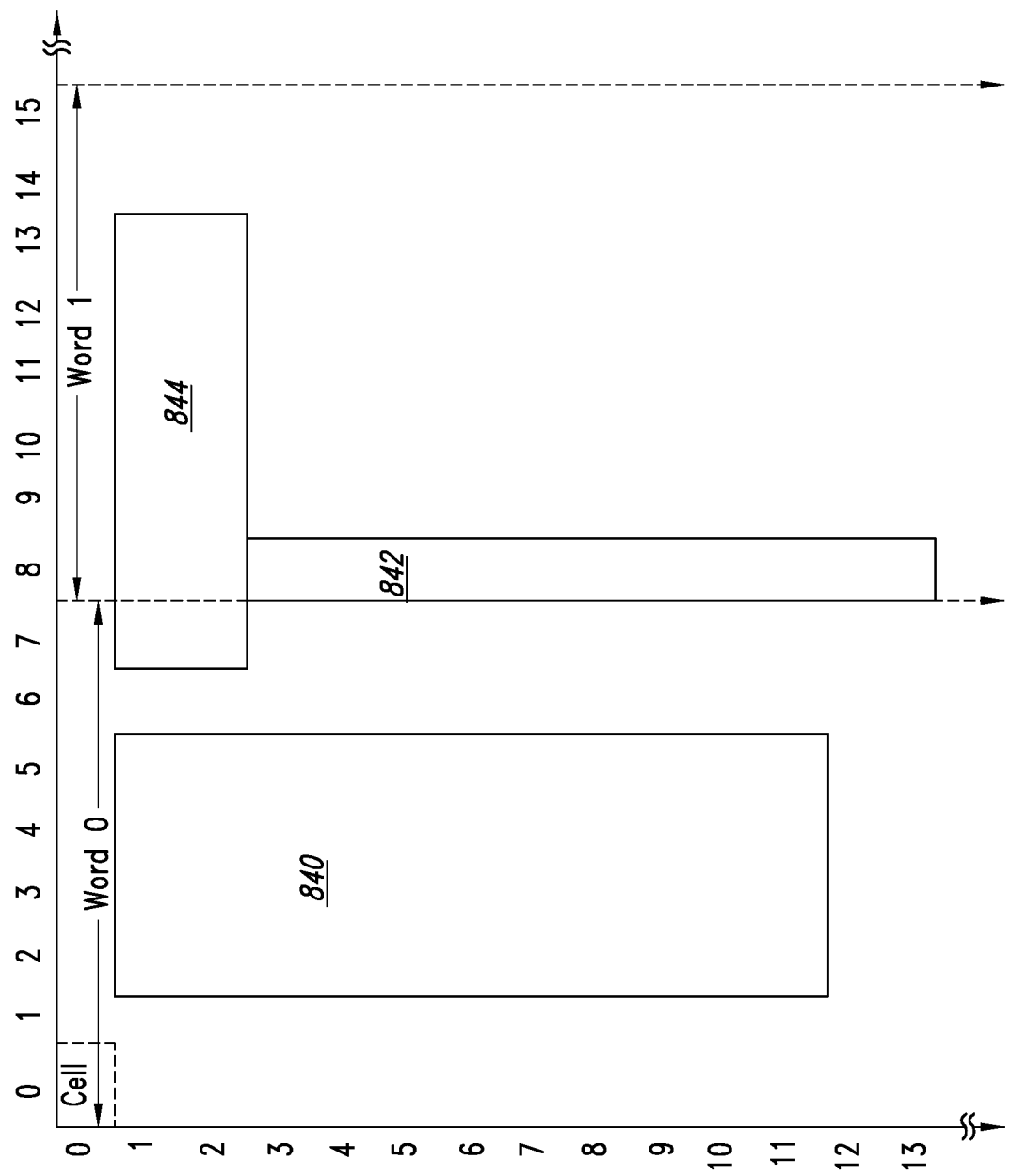
FIG. 8 conceptually illustrates accessing regions of a memory array organized in two dimensions.

FIG. 8 illustrates a two-dimensional representation of a portion of a memory array 802 and example regions of the memory array that may be accessed in a streaming manner. A two-dimensional array is shown for ease of illustration, but three dimensional arrays may be employed in some embodiments. As illustrated, rows 0 to 13 of columns 0 to 15 are shown. As illustrated, columns 0 to 7 of a row correspond to a first word, and columns 8 to 15 of a row correspond to a second word.

A first example region 840 of memory cells to be streamingly accessed spans the cells from the cell in row 1, column 2 to the cell in row 11, column 5. The offset information provided to the configuration control circuitry 708 may indicate an offset addresses of row 1 and row 11, may indicate an offset address of row 1, and a size of 11 rows, etc., and various other types of offset information to indicate to the configuration control circuit that the desired access is a streaming access to the region 840. The offset information also may indicate offset addresses for the desired columns (e.g., in the case of a memory array addressable bit by bit instead of by word), or the output of unneeded columns may simply be ignored in the words output in response to the access request. Column or word offsets also may be employed when the array stores multiple sets of words in the columns to identify the words which store bits of the desired region. For example, word 0 may be indicated in an offset. The configuration information also may include in-memory compute information (e.g., functions to be applied to the data to be streamed, such as additions, cryptographic functions, etc.). Default configuration information may be employed, such as automatically applying cryptographic functions in the memory as the data is streamed.

A second example region 842 of memory cells to be streamingly accessed spans the cells from the cell in row 3, column 8 to the cell in row 13, column 8. The offset information provided to the configuration control circuitry 708 may indicate an offset addresses of row 3 and row 13, may indicate an offset address of row 3, and a size of 11 rows, etc., and various other types of offset information to indicate to the configuration control circuit that the desired access is a streaming access to the region 840. The offset information also may indicate an offset address for the desired column 8 (e.g., in the case of a memory array addressable by bit), or word (e.g., word 1) and the output of unneeded columns may simply be ignored in the words output in response to the streaming access request.

A third example region 844 of memory cells to be streamingly accessed spans the cells from the cell in row 1, column 7 to the cell in row 2, column 13. The offset information provided to the configuration control circuitry 708 may indicate an offset addresses of row 1 and row 2, may indicate an offset address of row 1, and a size of 2 rows, etc., and various other types of offset information to indicate to the configuration control circuit that the desired access is a streaming access to the region 840. The offset information also may indicate an offset addresses for the desired columns 7 to 13, or an offset column of 7 and a number of columns of 7 (e.g., in the case of a memory array addressable by bit), or words (e.g., words 0 and 1 since the region to be accessed spans two words, or an offset of word 0, and a number of word of 2) and the output of unneeded columns may simply be ignored in the words output in response to the access request.

The requests may include configuration information indicating, for example, the desired streaming access should be repeated a certain number of times. For example, the request to access region 840 may be repeated four times in an embodiment so the data stored in each column 2-5 of the region of rows may be streamingly provided to an adder tree. Other types of configuration information, such as discussed elsewhere herein, may be employed.

Figure 9:
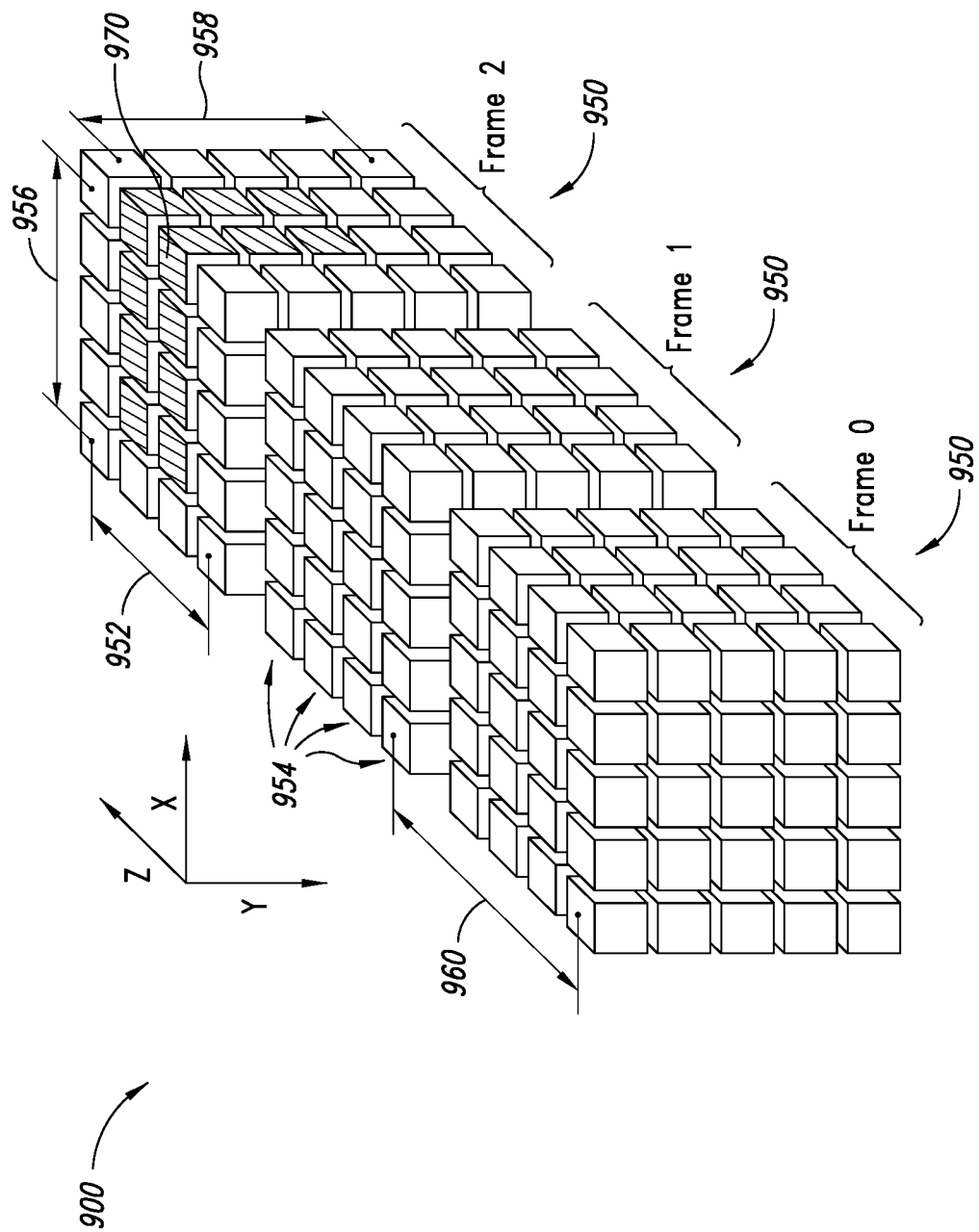
FIG. 9 conceptually illustrates accessing regions of multi-dimensional data structure in a streaming access memory.

The concept of streaming memory access to a region of a memory may be expanded to three-dimensional representations of a region of the memory. FIG. 9 illustrates a three-dimensional representation of a portion of a memory 900 and example regions of cells of the memory 900 that may be accessed in a streaming manner. As illustrated, the memory is organized into a number F of frames 950 (three frames F are shown). As illustrated, each frame has a depth or z dimension 952, which indicates a number Z of arrays 954 in the frame 950 (four arrays per frame as shown), a width or x dimension 956, which indicates a pixel (word) width X of each array (five pixels as shown), and a height or y dimension 958, which indicates a line height Y of each array (five lines as shown). A frame offset 960 indicates a number of arrays between an array of a first frame and the corresponding array of an adjacent frame in bytes (as illustrated the frame offset is 5). Elements (pixels) in the array may be accessed by specifying a frame offset f, a depth offset z, a width offset x and a height offset y (e.g., offsets $\{f, z, x, y\}$). A region to be accessed in a streaming access may be defined by specifying a frame f, a beginning z offset $z_1$, an ending z offset $z_2$, a beginning x offset $x_1$, an ending x offset $x_2$, a beginning y offset $y_1$ and an ending y offset $y_2$ (e.g., a region may be defined by $\{f, z_1, z_2, x_1, x_2, y_1, y_2\}$). As shown in FIG. 9, a region 970 (only a portion of which is shown) may be defined by the parameters {2 (frame), 1 (beginning frame offset, 2 (ending frame offset), 1 (beginning width offset), 4 (ending width offset), 0 (beginning row offset), 2 (ending row offset)}.

Instead of specifying ending offsets, distances may be specified. For example, a region to be accessed may be defined by specifying a frame f, a beginning z offset $z_1$, a number of arrays $z_n$, a beginning x offset $x_1$, a number of pixels $x_n$, a beginning y offset $y_1$ and a number of lines $y_n$ (e.g., a region may be defined by $\{f, z_1, z_n, x_1, x_n, y_1, y_n\}$). Hexadecimal representations may be used to specify the offsets and distances. The parameters may be specified in various orders.

Omitted information may be defined to indicate that offset ranges for a particular parameter are not applicable. For example, a region defined only by a frame number parameter may be defined to indicate the region comprises the entire frame. In another example, a region defined by a frame, depth offsets and pixel offsets without specifying any line offsets may be defined as including all of the lines of the specified pixels at the specified depths are included in the region. In another example, a region defined by a frame number, depth offsets, pixel offsets and a beginning row offset may indicate the region includes all of the rows beginning with the beginning row offset. Other definitions may be employed to interpret the parameters specifying a region of the memory.

Other configuration information or parameters may be specified to indicate how the defined region is to be accessed. For example, a parameter may be provided to indicate the region is to be processed in a particular order (e.g., from the ending offset to the beginning offset instead of from the beginning offset to the ending offset), to indicate each column or each row is to be repeatedly accessed a particular number of times, to indicate every other row is to be accessed, instead of each row in a region, etc.

In another example, striding parameters may be set to indicate a first region of a given dimension is to be accessed, and then an adjacent region of the same size is to be accessed, a region a certain distance from the first region is to be accessed, etc. Sliding windows may be defined, with a step size (corresponding to overlapping or non-overlapping regions of a defined size) to specify successive regions in the memory to be accessed.

FIG. 9 may be viewed as an illustration of a sliding window or striding application in which the window size is a frame. A first access processes the pixels of the first frame as defined by the frame size parameters Z, X and Y (e.g., starting at a specified pixel of 0,0,0). The starting pixel is shifted by a frame offset (e.g., 960) and the frame size parameters are used to define a second region for the second access. The process is repeated to define a third region for a third access, etc., until a specified number of frames (regions) are processed.

Figure 10:
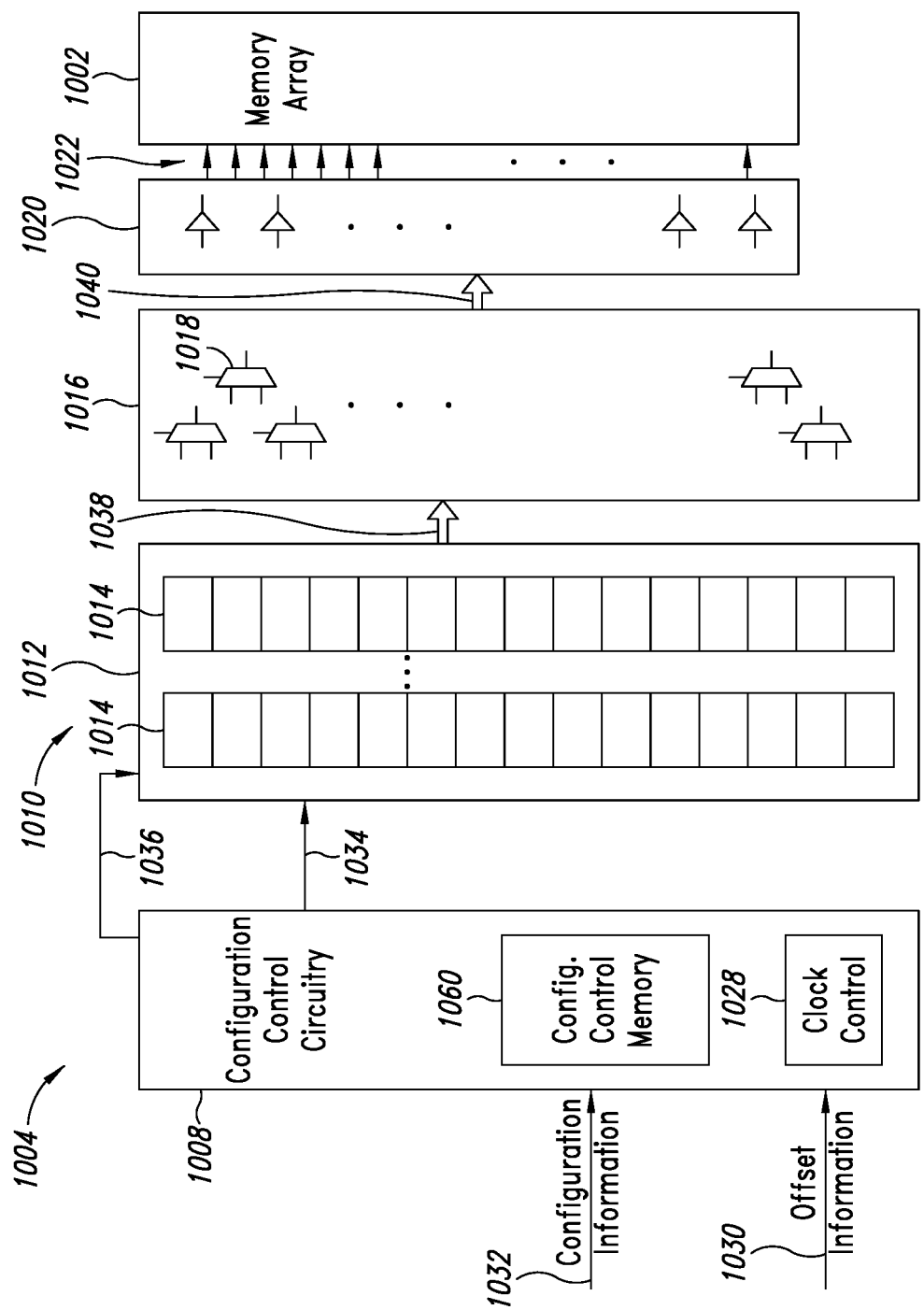
FIG. 10 is a functional block diagram of an embodiment of streaming access control circuitry that may be employed in a streaming access memory.

FIG. 10 illustrates a functional block diagram of streaming access control circuitry 1004 that may be employed, for example, in the embodiment of FIG. 7 as the access control circuitry 704. The access control circuitry 1004 includes configuration control circuitry 1008 and stream control circuitry 1010. The stream control circuitry includes a plurality or collar 1012 of shift registers 1014, a bank 1016 of multiplexers 1018, and a bank of word line buffers 1020, which drive word lines 1022 coupled to a memory array 1002. In some embodiments, the access control circuitry 1004 may be coupled to a plurality of memory arrays, for example, logically or physically organized into a three-dimensional memory (see FIG. 9).

The configuration control circuitry 1008 receives offset information 1030 (e.g., one or more offsets defining a region of memory or a starting point in the memory, such as a memory organized in a three-dimensional space (see FIG.

9)) and configuration information 1032 (e.g., an order in which to access memory cells of the defined region of the memory or starting from the defined starting point in the memory), in-memory compute information (e.g., functions to be applied to the data to be accessed) as illustrated includes clock generation or control circuitry 1028. Based on the received offset information 1030 and the received configuration information 1032, the configuration control circuitry generates registry data 1034 to be loaded into the shift registers 1014 and stream control signals 1036 to control clocking, initializing/loading, and shifting (incrementing/decrementing) of the shift registers 1014. The registry data 1034 and control signals may be loaded into the bank of shift registers 1012 in a parallel or a serial manner (e.g., via a plurality of lines coupled to respective inputs of the shift registers 1014 of the bank of shift registers 1012. Outputs 1038 of the shift registers are coupled to respective inputs and select lines of the multiplexers 1018 of the bank of the bank of multiplexers 1016. Look-up tables may be employed to generate the registry data 1034 and control signals to be provided to the bank of shift registers 1012 by the configuration control circuitry 1008. Outputs 1040 of the bank of multiplexers are coupled to respective word line buffers of the bank of word line buffers 1020.

Configuration control circuitry 1008 as illustrated includes a configuration control memory 1060 to store information regarding data regions in the memory array or arrays 1002. For example, region definitions, sizes, shapes, accessing control parameters, in—memory compute parameters, etc., may be stored in the configuration control memory 1060 (e.g., via the offset information 1030 and configuration information 1032 inputs) and retrieved or activated via a command provided to the configuration control circuitry 1008. Memory maps may be stored in the configuration control memory 1060 and used to control streaming accesses to the memory array 1002.

Multiple processes may utilize access control circuitry 1004 to access memory array 1002. Configuration control circuitry 1008 may determine a process accessing one or more memory arrays 1002 and determine a region of memory associated with the process and a streaming access algorithm associated with the process (e.g., by identifying a stored region definition and a stored accessing algorithm (which may include in-memory compute operations) associated with an identified process).

Figure 11:
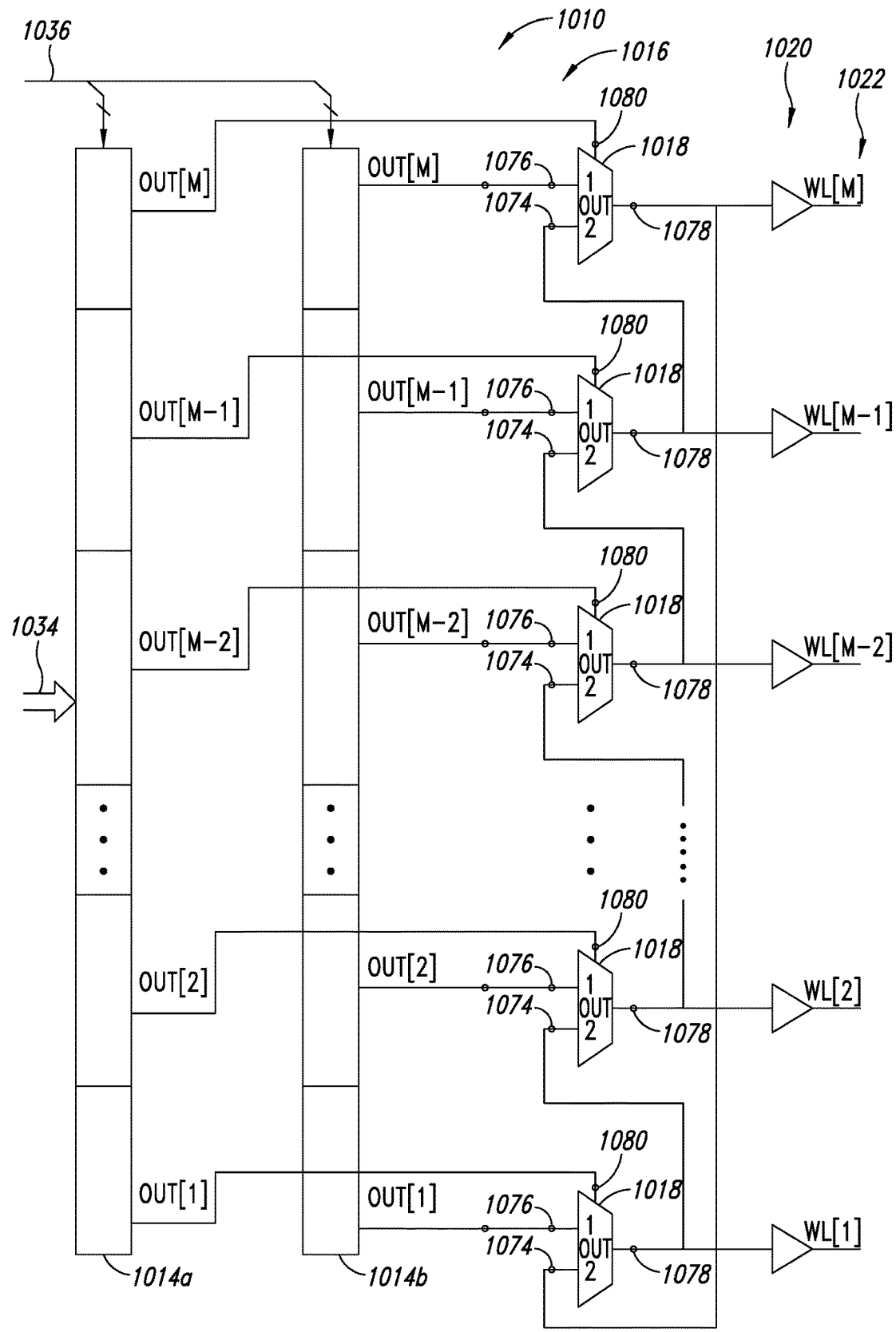
FIG. 11 is a functional block diagram of an embodiment of stream control circuitry that may be employed in a streaming access controller.

FIG. 11 is a functional block diagram illustrating an example configuration of a portion of the stream control circuitry 1010 of FIG. 10. The bank of shift registers 1012 includes shift registers 1014a and 1014b. Shift registers 1014a and 1014b are coupled to the configuration control circuitry 1008 by stream control signal lines 1036, controlling the receipt of register data 1034 and shifting of data contained in shift registers 1014a and 1014b. Shift register 1014a is comprised of M data bits, coupled together such that when a select signal is asserted and a valid clock edge occurs, the bits of the shift register 1014a are shifted to an adjacent bit cell in a direction indicated by an up/down control signal of the stream control lines 1036. The shift register 1014a may be configured to circularly shift contents such that the first bit of the shift register 1014a may receive the contents of the last bit of shift register 1014a or visa/versa depending on the direction of the shift. Shift register 1014b is coupled to the configuration control circuitry 1008 by configuration control or stream control lines 1036 and configured in a similar manner as shift register 1014a.

The outputs of shift register 1014b are coupled to respective first multiplexer inputs 1076 of the bank of multiplexers 1016. When the first multiplexed input 1076 of the array of multiplexers 1016 is selected, the contents of shift register 1014b are output to the word lines 1022.

The bank of multiplexers 1016 is coupled between the bank of shift registers 1012 and the memory array(s) 1002. Each multiplexer 1018 in the bank of multiplexers 1016 has an output 1078 that is coupled to a respective word line 1022 in the memory array(s) 1002 via a respective buffer of the bank of buffers 1020. Each bit output of shift register 1014a is coupled to a multiplexer control input 1080 of a respective multiplexer 1018 of the bank of multiplexers 1016. The multiplexers 1018 of the bank of multiplexers 1016 are coupled together in a circular manner, with a respective second input of each multiplexer coupled to an output of an adjacent multiplexer in the bank of multiplexers.

Figure 12:
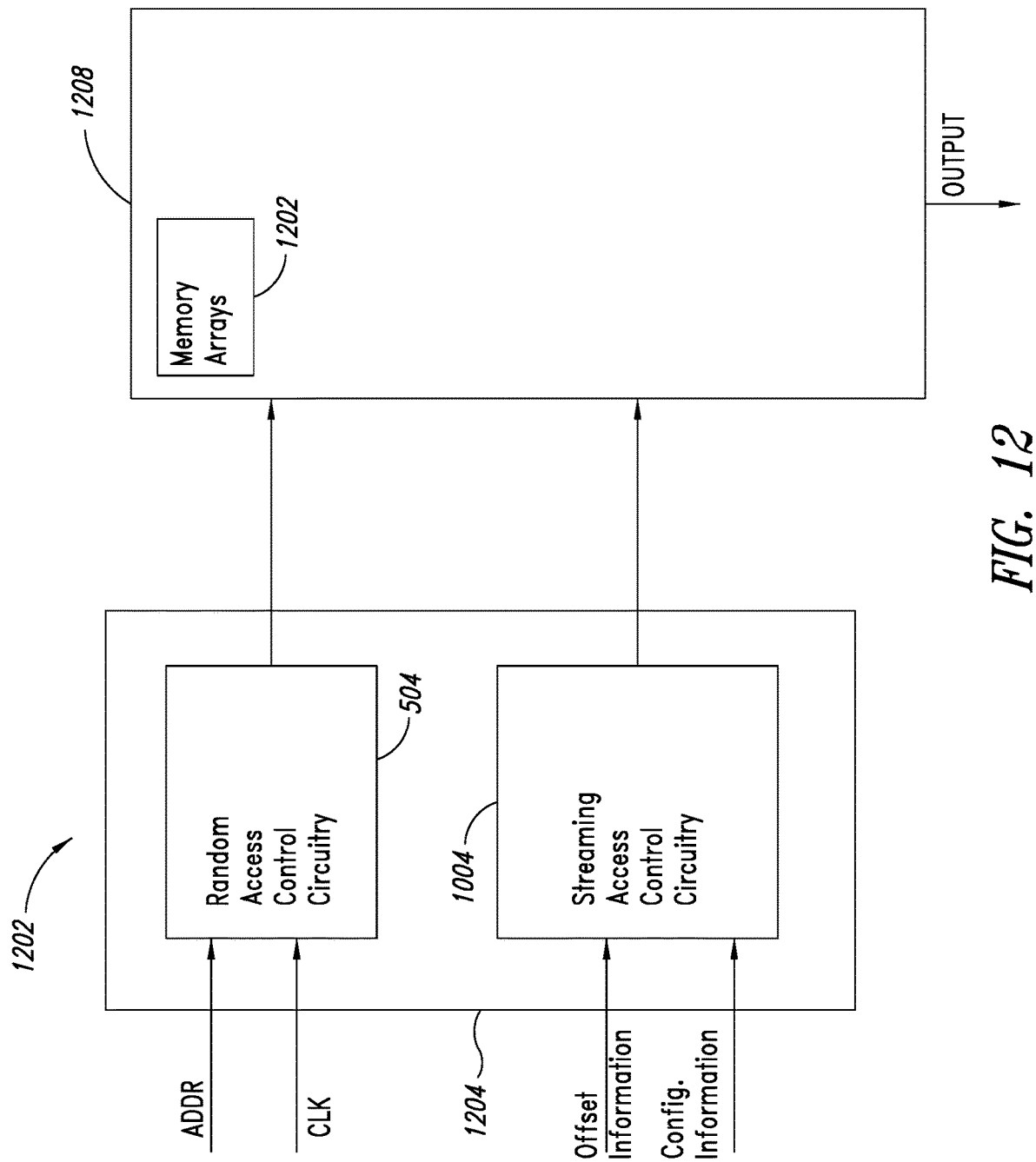
FIG. 12 is a functional block diagram of an embodiment of a shared memory having random access decoding circuitry and streaming access control circuitry.

FIG. 12 is a functional block diagram illustrating an embodiment of a memory 1202 employing access control circuitry 1204 including random access control circuitry 504, which may be similar to the random access control circuitry 504 of FIG. 5, and streaming access control circuitry 1004, which may be similar to the streaming access control circuitry 1004 of FIG. 10, to access a plurality of memory arrays 1208 of the memory 1202. In response to receipt of a memory access request, the access control circuitry 1204 determines a type of access request (e.g., a random access request specifying an address in the memory arrays 1208 to access or a streaming access request) and processes the request in accordance with the determined type of access request. For example, a type of process initiating the memory access request may indicate the type of request; the control lines on which the request is received may indicate the type of request; the request format may indicate the type of request; etc. In response to determining a request is a random access request, the access control circuitry 1204 uses the random access control circuitry 504 to access an address in the memory arrays 1208. In response to determining a request is a streaming access request, the access control circuitry uses the streaming access control circuitry 1004 to access a region of the memory in the memory arrays 1208. The embodiment of a memory 1202 of FIG. 12 may be employed, for example, as a shared memory, for example, as the global memory 202 of FIG. 2, and may provide improved throughput for streaming memory accesses at lower power costs than using random access control circuitry to perform streaming access to memory.

Embodiments of the memory 1202 may include more components than illustrated, may contain fewer components than illustrated, may combine illustrated components, and may separate illustrated components in various manners. For example, an embodiment may include multiplexing circuitry to selectively couple one of the random access control circuitry 504 and the streaming access control circuitry 1004 to address lines of the plurality of memory arrays 1208. In another example, the random access control circuitry 504 and the streaming access control circuitry 1004 may be combined in an embodiment.

Figure 13:
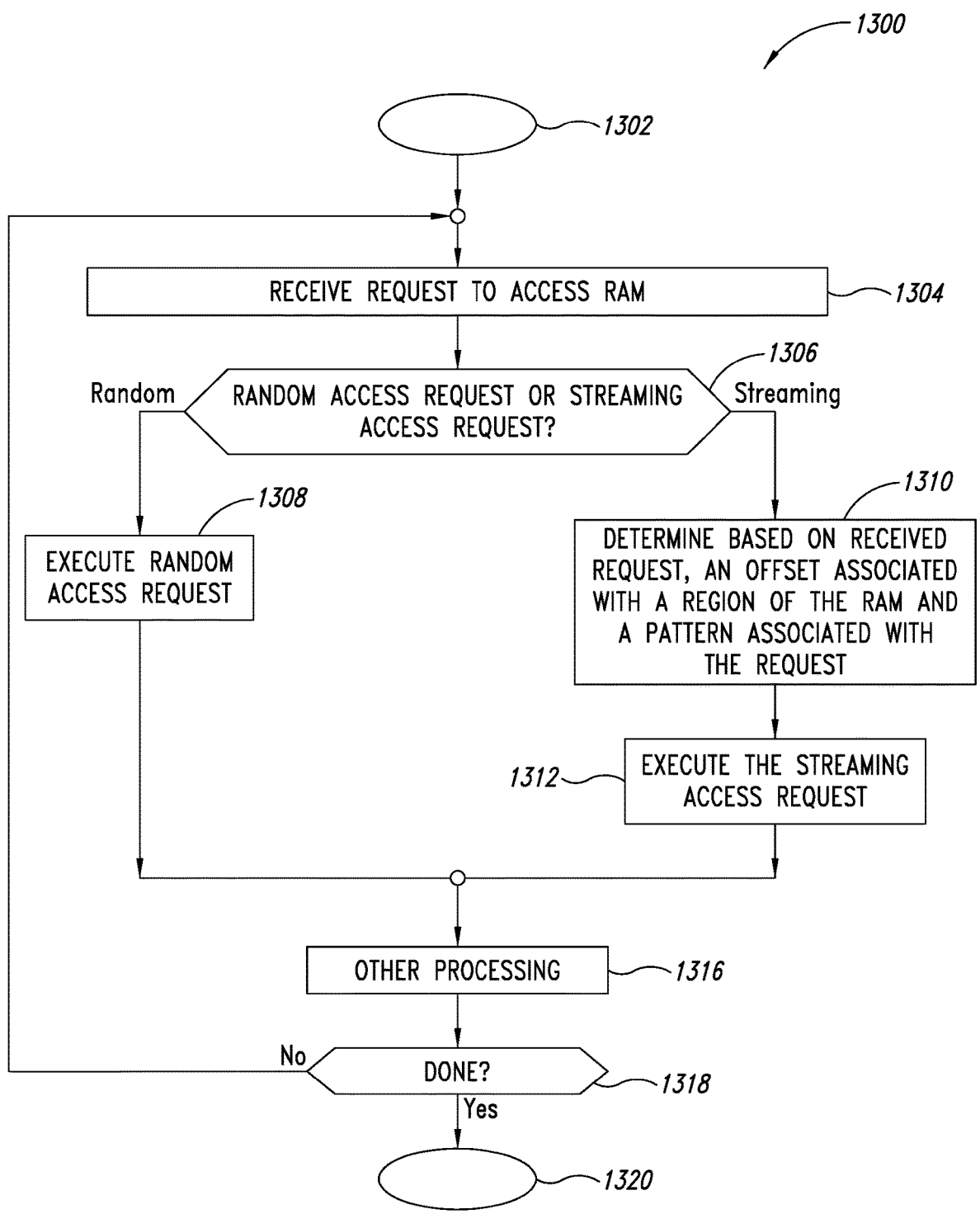
FIG. 13 illustrates an embodiment of a method of accessing a memory.

FIG. 13 illustrates an embodiment of a method 1300 of accessing a random access memory, embodiments of which may be employed, for example, by the system 100 of FIG. 1, the system 200 of FIG. 2, the system 700 of FIG. 7, or the memory 1202 of FIG. 12. The method 1300 of FIG. 13 will be described for convenience with reference to FIGS. 7 and 10-12.

The method 1300 starts at 1302. The method 1300 may be started, for example, in response to a power-up of a random access memory, such as the random access memory 1208 of FIG. 12, to respond to requests to access the random access memory. The method 1300 proceeds from 1302 to 1304.

At 1304, the method 1300 receives a request to access the random access memory. The request may be received, for example, from a host system, such as the host system 204 of FIG. 2, from a data mover associated with a convolutional accelerator engine, such as the data mover 210 associated with the convolutional accelerator engine 240 of FIG. 2, from a convolutional accelerator or a process associated with the convolutional accelerator, such as the convolutional accelerator 400 of FIG. 4, etc. The method 1300 proceeds from 1304 to 1306.

At 1306, the method 1300 determines whether the request is a random access request or a streaming access request. This may be done, for example, based on a source of the request, a format of the request, etc., and various combinations thereof, as discussed elsewhere herein.

When it is determined at 1306 that the request is a random access request, the method 1300 proceeds from 1306 to 1308, where the method executes the random access request. Execution of the random access request may be done in a conventional manner, for example, as discussed above with reference to FIGS. 5, 6 and 12. The method proceeds from 1308 to 1316.

When it is determined at 1306 that the request is a streaming access request, the method 1300 proceeds from 1306 to 1310. At 1310, the method determines an offset associated with a determined region of the random access memory and a pattern of the streaming access request based on the streaming access request. The may be done, for example, based on explicit indications included in the streaming access request, based on stored information associated with a command included in the streaming access request, based on default settings, based on a look-up table, based on the source of the streaming access request, etc., and various combinations thereof. Act 1310 may be performed, for example, by the streaming access control circuitry 704 of FIG. 7, by the streaming access control circuitry 1004 of FIGS. 10 and 12. The method 1300 proceeds from 1310 to 1312.

At 1312, the method 1300 executes the streaming access request based on the determined offset associated with the determined region of the random access memory and the determined pattern of the streaming access request. This may be done, for example, by identifying the determined region based on the offset or based on the offset and the pattern, and activating word lines of the random access memory to access the words of the determined region in accordance with the pattern. Act 1312 may be performed, for example, by the streaming access control circuitry 704 of FIG. 7, by the streaming access control circuitry 1004 of FIGS. 10 and 12. The method 1300 proceeds from 1312 to 1316. Executing the streaming access request may include performing in-memory compute operations, such as adding data stored in a region of the memory, XORing streams of data, etc.

At 1316, the method 1300 optionally performs other processing associated with the received request to access the random access memory, such as processing to indicate the random access memory may process another request. The method 1300 proceeds from 1316 to 1318.

At 1318, the method 1300 determines whether the method 1300 is finished or should continue, such as in response to a host control signal. When it is determined at 1318 that processing of memory access requests is finished (Yes at 1318), the method 1300 proceeds to 1320. At 1320, the method 1300 may terminate, may perform other processes (such as error processing), etc. When it is not determined at 1318 that processing of memory access requests is finished, the method 1300 returns to 1304 to wait for another request to access the random access memory.

Embodiments of methods of processing access requests to a random access memory may contain additional acts not shown in FIG. 13, may not contain all of the acts shown in FIG. 13, may perform acts shown in FIG. 13 in various orders, and may be modified in various respects. For example, the method 1300 may omit acts 1306 and 1308 when the memory is dedicated to streaming memory access requests.

Some embodiments may take the form of or comprise computer program products. For example, according to one embodiment there is provided a computer readable medium comprising a computer program adapted to perform one or more of the methods or functions described above. The medium may be a physical storage medium, such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the methods and/or functionality may be implemented or provided in other manners, such as at least partially in firmware and/or hardware, including, but not limited to, one or more application-specific integrated circuits (ASICs), digital signal processors, discrete circuitry, logic gates, standard integrated circuits, controllers (e.g., by executing appropriate instructions, and including microcontrollers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. Aspects of the embodiments can be modified, if necessary to employ concepts of the various embodiments and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
one or more inputs configured to receive a streaming access request to access a plurality of individually addressable words of a determined region of a random access memory, the request indicating an offset associated with the determined region and a streaming access request pattern associated with the streaming access request, wherein the indicated offset and the streaming access request pattern associated with the streaming access request together define the determined region of the random access memory containing the plurality of individually addressable words;
a plurality of outputs configured to couple to word lines of the random access memory; and streaming access control circuitry coupled to the one or more inputs and to the plurality of outputs and configured to respond to the streaming access request by generating, based on the indicated offset and the indicated streaming access request pattern, control signals to drive the word lines to access the plurality of individually addressable words of the determined region.

2. The device of claim 1 wherein the request includes the offset associated with the determined region.

3. The device of claim 2 wherein the request includes an indication of the streaming access request pattern associated with the streaming access.

4. The device of claim 3 wherein the streaming access control circuitry includes a memory configured to store streaming access control information and the indication is a command to perform a streaming access based on stored streaming access control information.

5. The device of claim 1 wherein the request indicates a plurality of offsets, and the plurality of indicated offsets and the streaming access request pattern associated with the streaming access request together define the determined region of the random access memory.

6. The device of claim 1 wherein the streaming access control circuitry comprises:
stream control circuitry configured to generate the control signals to drive the word lines, the stream control circuitry including a plurality of shift registers and a bank of multiplexers coupled to the plurality of shift registers; and
configuration control circuitry configured to generate register data and control signals to control loading of the register data into the plurality of shift registers and shifting of the plurality of shift registers.

7. The device of claim 6 wherein a first data input of each multiplexer of the bank of multiplexers is coupled to a respective output of one of the plurality of shift registers and a select input of each multiplexer of the bank of multiplexers is coupled to a respective output of another of the plurality of shift registers.

8. The device of claim 7 wherein a second data input of each multiplexer of the bank of multiplexers is coupled to an output of an adjacent multiplexer in the bank of multiplexers and the plurality of outputs are coupled to respective outputs of multiplexers of the bank of multiplexers.

9. The device of claim 1 wherein the random access memory is addressable in a three-dimensional address space.

10. The device of claim 1 wherein the streaming access control circuitry is configured generate control signals to perform one or more in-memory compute operations associated with the streaming access request.

11. The device of claim 1, comprising:
random access control circuitry separate from the streaming access control circuitry and configured to couple to the word lines of the random access memory, wherein the random access control circuitry, in operation, responds to a request to access an individually addressable word of the random access memory.

12. A system, comprising:
a random access memory organized into individually addressable words; and
streaming access control circuitry coupled to word lines of the random access memory, wherein the streaming access control circuitry, in operation, responds to a request to streamingly access a plurality of individually addressable words of a determined region of the random access memory by generating control signals to drive the word lines to access the plurality of individually addressable words of the determined region, wherein the request indicates an offset associated with the determined region and a streaming access request pattern associated with the streaming access, and the indicated offset and the indicated streaming access request pattern associated with the streaming access request together define the determined region of the random access memory containing the plurality of individually addressable words.

13. The system of claim 12 wherein the request includes the offset associated with the determined region.

14. The system of claim 13 wherein the request includes an indication of a sequence of the streaming access.

15. The system of claim 12 wherein the request indicates a plurality of offsets associated with the determined region.

16. The system of claim 12 wherein the request indicates a plurality of offsets defining the determined region.

17. The system of claim 12 wherein the streaming access control circuitry comprises:
stream control circuitry configured to generate the control signals to drive the word lines, the stream control circuitry including a plurality of shift registers and a bank of multiplexers coupled to the plurality of shift registers; and
configuration control circuitry configured to generate register data and control signals to control loading of the register data into the plurality of shift registers and shifting of the plurality of shift registers.

18. The system of claim 12 wherein the random access memory is addressable in a three-dimensional address space.

19. The system of claim 12, comprising random access control circuitry separate from the streaming access control circuitry and coupled to the word lines of the random access memory, wherein the random access control circuitry, in operation, responds to a request to access an individually addressable word of the random access memory.

20. The system of claim 12, comprising one or more convolutional accelerators coupled to the streaming access control circuitry and to the random access memory, wherein, in operation, the one or more convolutional accelerators provide requests to streamingly access a plurality of individually addressable words of a determined region of the random access memory to the streaming access control circuitry and receive responses to the requests from the random access memory.

21. The system of claim 12 wherein the random access memory comprises storage elements and one or more in-memory compute elements, and the streaming access control circuitry, in operation, responds to a streaming access request associated with an in-memory compute operation by generating control signals to perform the in-memory compute operation using in-memory compute elements of the random access memory.

22. The method of claim 21, comprising:
receiving, by random access control circuitry of the random access memory, the random access control circuitry being separate from the streaming access control circuitry, a request to access an individually addressable word of the random access memory; and
responding, by the random access control circuitry, to the request to access the individually addressable word of the random access memory.

23. A method, comprising:
receiving, by streaming access control circuitry of a random access memory, a streaming access request to access a plurality of individually addressable words of a determined region of the random access memory, the request indicating an offset associated with the determined region and a streaming access request pattern associated with the streaming access; and responding, by the streaming access control circuitry, to the request by generating control signals, based on the indicated offset and the indicated streaming access request pattern, to drive word lines of the random access memory to access the plurality of individually addressable words of the determined region, wherein the indicated offset and the indicated streaming access request pattern associated with the streaming access request together define the determined region of the random access memory containing the plurality of individually addressable words.

24. The method of claim 23 wherein the request includes the offset associated with the determined region.

25. The method of claim 24, comprising storing, in a memory of the streaming access control circuitry, streaming access control information, wherein the indication of the streaming access request pattern is a command to perform a streaming access based on stored streaming access control information.

26. The method of claim 23 wherein the request indicates a plurality of offsets defining the determined region.

27. The method of claim 23 wherein the random access memory is addressable in a three-dimensional address space.

28. The method of claim 23 wherein the streaming access request is associated with an in-memory compute operation and the method comprises performing the in-memory compute operation as part of the response to the streaming access request.

29. A non-transitory computer-readable medium having contents which configure a streaming access controller of a random access memory to perform a method, the method comprising:

receiving a streaming access request to access a plurality of individually addressable words of a determined region of the random access memory, the request indicating an offset associated with the determined region and a streaming access request pattern associated with the streaming access, wherein the indicated offset and the indicated streaming access request pattern associated with the streaming access request together define the determined region of the random access memory containing the plurality of individually addressable words; and responding to the request by generating control signals, based on the indicated offset and the indicated streaming access request pattern, to drive word lines of the random access memory to access the plurality of individually addressable words of the determined region.

30. The non-transitory computer-readable medium of claim 29 wherein the request includes the offset associated with the determined region and an indication of the streaming access request pattern of the streaming access.

31. The non-transitory computer-readable medium of claim 29 wherein the random access memory is addressable in a three-dimensional address space and the determined region is a three-dimensional region in the three-dimensional address space.

32. The non-transitory computer-readable medium of claim 29 wherein the contents comprise a look-up table storing registry and timing information used by the streaming access controller to generate the control signals to drive the word lines.

33. The non-transitory computer-readable medium of claim 29, wherein the contents configure a random access controller of the random access memory to perform a random access method, the random access method comprising:

receiving, by the random access controller, a request to access an individually addressable word of the random access memory; and responding, by the random access controller, to the request to access the individually addressable word of the random access memory.

* * * * *